United States Patent [19]

Shibano

[11] Patent Number: 5,439,015
[45] Date of Patent: Aug. 8, 1995

[54] CLEANING APPARATUS

[76] Inventor: Yoshihide Shibano, 1629-1-12, Oyama-cho, Machida-shi, Tokyo, Japan

[21] Appl. No.: 218,364

[22] Filed: Mar. 28, 1994

[51] Int. Cl.⁶ .............................................. B08B 3/04
[52] U.S. Cl. ..................................... 134/66; 134/83
[58] Field of Search ............................ 134/66, 82, 83

[56] References Cited

U.S. PATENT DOCUMENTS

| | | | |
|---|---|---|---|
| 2,851,044 | 9/1958 | Davis | 134/83 X |
| 2,989,060 | 6/1961 | Finston | 134/83 X |
| 3,106,927 | 10/1963 | Madwed | 134/83 X |
| 3,381,695 | 5/1968 | Clark | 134/83 X |
| 3,443,852 | 5/1969 | Binks et al. | 134/82 X |
| 3,476,126 | 11/1969 | Pinkham | 134/83 X |
| 4,932,427 | 6/1990 | Yamada et al. | 134/66 |

*Primary Examiner*—Philip R. Coe
*Attorney, Agent, or Firm*—Paul A. Guss

[57] ABSTRACT

A cleaning apparatus for ultrasonically cleaning workpieces has an array of juxtaposed tanks including an ultrasonic cleaning tank, and a plurality of supports associated with the respective tanks for vertical movement between lower positions in the tanks and upper positions above the tanks. The tanks are separably joined so that they are selectively replaceable with other tanks. The supports support workpieces processed in the tanks, respectively, for sliding movement toward adjacent ones of the tanks. A lifting and lowering mechanism simultaneously lowers the supports into the tanks, respectively, to allow the workpieces to be processed in the tanks, and simultaneously lifts the supports from the lower positions in the tanks up to the upper positions above the tanks after the workpieces supported on the supports lowered in the tanks are processed in the tanks. The workpieces supported on the supports are simultaneously slid by a feed mechanism onto the supports associated with adjacent ones of the tanks while the supports are being lifted to the upper positions.

18 Claims, 5 Drawing Sheets

CLEANING APPARATUS

BACKGROUND OF THE INVENTION

1. Field of the Invention

The present invention relates to a cleaning apparatus having a plurality of tanks including a cleaning tank.

2. Description of the Prior Art

As is well known in the art, workpieces such as precision mechanical parts, electronic parts, or the like are cleaned by cleaning apparatus in various cleaning processes including an ultrasonic cleaning process, an ultrasonic rinsing process, and a drying process depending on the type of workpieces to be cleaned and the degree of accuracy to which they are to be cleaned. The cleaning apparatus have tanks in which the respective processes are carried out. To clean and rinse a workpiece with a cleaning apparatus which has an ultrasonic cleaning tank and an ultrasonic rinsing tank, for example, the workpiece is horizontally slidably supported by a support disposed above the ultrasonic cleaning tank, and then lowered into the ultrasonic cleaning tank. After the workpiece is cleaned in the ultrasonic cleaning tank, the workpiece is lifted up to the original position above the ultrasonic cleaning tank. Then, the workpiece is transferred to a position above the ultrasonic rinsing tank, and horizontally slidably supported by a support disposed above the ultrasonic rinsing tank. Thereafter, the workpiece is lowered into the ultrasonic cleaning tank in which it is rinsed. In this manner, the workpiece is cleaned and rinsed by the cleaning apparatus.

In the cleaning apparatus, the ultrasonic cleaning tank and the ultrasonic rinsing tank are integral with each other. Such an integral tank arrangement suffers the following difficulties:

Sometimes, it is necessary to replace one of these tanks with another tank in view of the type of workpieces to be cleaned and the degree of accuracy to which they are to be cleaned. However, since the ultrasonic cleaning tank and the ultrasonic rinsing tank are integral with each other, all the tanks have to be replaced even though only the replacement of one tank is required. This is more costly than necessary. In the event of a failure of one of the tanks, e.g., the ultrasonic cleaning tank, the entire cleaning apparatus needs to be shut off until the ultrasonic cleaning tank is repaired. Even when the type of workpieces to be cleaned and the degree of accuracy to which they are to be cleaned requires the addition of another processing tank or make one of the existing tanks unnecessary, such another processing tank cannot be added or the unnecessary tank cannot be removed. If another processing tank is additionally needed, the existing cleaning apparatus has to be replaced as a whole with a new cleaning apparatus which includes such another processing tank integral with other tanks. As a consequence, cleaning workpieces of different types or to different degrees of accuracy necessitates different types of cleaning apparatus, resulting in a large expenditure of money for an investment in the equipment.

When a workpiece is ultrasonically cleaned, an ultrasonic energy is radiated from below the workpiece and applied to the workpiece. Therefore, the workpiece should be supported by a support such that the bottom of the workpiece will not be covered by the support.

SUMMARY OF THE INVENTION

It is therefore an object of the present invention to provide a cleaning apparatus having a plurality of tanks that can selectively be replaced with a new tank.

Another object of the present invention is to provide a cleaning apparatus which can easily be modified into a desired apparatus configuration depending on type of workpieces to be cleaned and the degree of accuracy to which they are to be cleaned.

Still another object of the present invention is to provide a cleaning apparatus which can sufficiently clean workpieces.

According to the present invention, there is provided a cleaning apparatus comprising an array of juxtaposed tanks including a cleaning tank, a plurality of supports associated with the respective tanks for vertical movement between lower positions in the tanks and upper positions above the tanks, for supporting workpieces processed in the tanks, respectively, for sliding movement toward adjacent ones of the tanks, lifting and lowering means for simultaneously lowering the supports into the tanks, respectively, to allow the workpieces to be processed in the tanks, and simultaneously lifting the supports from the lower positions in the tanks up to the upper positions above the tanks after the workpieces supported on the supports lowered in the tanks are processed in the tanks, and feed means for simultaneously sliding the workpieces supported on the supports onto the supports associated with adjacent ones of the tanks while the supports are being lifted to the upper positions, the tanks being joined for selective replacement.

Since the tanks are joined for selective replacement, the tanks may be independently replaced with new tanks. If one of the tanks fails to operate, then it may be replaced with a new tank, making it possible to allow the cleaning apparatus to operate continuously without fail. If lifting and lowering means and feed means are associated with the respective tanks, then the tanks with those means may be handled as unit tanks. With such an arrangement, in the event that a new tank for processing workpieces differently is needed or any of the existing tanks is no longer necessary depending on the type of workpieces, such a new tank may easily be added to the cleaning apparatus, or such an unnecessary tank may easily be deleted from the cleaning apparatus. Therefore, depending on the type of workpieces to be cleaned, a desired cleaning apparatus configuration can be achieved more simply and inexpensively than the conventional cleaning apparatus.

Where the tanks are constructed as unit tanks combined with lifting and lowering means and feed means, the lifting and lowering means and feed means may be independently associated with the tanks, as described above, and should preferably be arranged as follows:

The feed means may comprise a plurality of mobile assemblies positioned above the tanks, respectively, for movement toward adjacent ones of the tanks, a plurality of pressers mounted on the mobile assemblies for pressing the workpieces on the supports toward adjacent ones of the tanks when the mobile assemblies move toward adjacent ones of the tanks while the supports supporting the workpieces are being lifted to the upper positions, and actuating means coupled to at least one of the mobile assemblies for moving the mobile assembly to an adjacent one of the tanks while the supports supporting the workpieces are being lifted to the upper positions, the mobile assemblies being separably joined between the tanks.

With such an arrangement, the mobile assemblies and the tanks may be combined into unit tanks, and such unit tanks may be selectively combined and joined depending on the type of workpieces to be cleaned, with the mobile assembly of at least one unit tank being joined to the actuating means, thus achieving a desired cleaning apparatus configuration. Even though the unit tanks are not provided with respective actuating means for actuating the mobile assemblies, the mobile assemblies may be actuated by the single actuating means in the desired cleaning apparatus configuration. Consequently, the desired cleaning apparatus configuration depending on the type of workpieces to be cleaned can easily and inexpensively be provided while simplifying the structure of each of the unit tanks.

The lifting and lowering means may comprise a plurality of drive shafts disposed respectively above the tanks for angular movement about their own axis and extending along the array of tanks, transmitting means for vertically moving the supports associated with the respective tanks in response to angular movement of the drive shafts, and actuating means for angularly moving the drive shafts to vertically move at least one of the supports, the drive shafts being separably joined between the tanks.

With such an arrangement, the drive shafts, the transmitting means, and the tanks may be combined into unit tanks. Even though the unit tanks are not provided with respective means for vertically moving the supports, a desired cleaning apparatus configuration can be achieved with the single actuating means for angularly moving the drive shafts. As a consequence, the desired cleaning apparatus configuration depending on the type of workpieces to be cleaned can easily and inexpensively be provided while simplifying the structure of each of the unit tanks.

The transmitting means may comprise a plurality of driven shafts disposed in the tanks, respectively, below the drive shafts and extending parallel to the drive shafts, and a plurality of endless elements trained around the drive shafts and the driven shafts, respectively, for transmitting angular movement of the drive shafts to the driven shafts, the supports being attached to the endless elements, respectively, between the drive shafts and the driven shafts, the actuating means comprising means for reversibly angularly moving the drive shafts to vertically move the supports. When the drive shafts are reversibly angularly moved by the actuating means, the supports can be lifted and lowered by such a simple structure.

To transfer the workpieces between the supports associated with the tanks, a plurality of guides may preferably be positioned between the tanks closely to adjacent ones of the supports while the supports are being lifted to the upper positions, for guiding each of the workpieces when they are transferred from one of the supports to an adjacent one of the supports. The workpieces can smoothly be transferred between the supports of the tanks by being guided by the guided.

The guides may be separably joined between the tanks, so that the tanks may be unitized in combination with the guides.

To process the workpieces, e.g., clean the workpieces, in the tanks, it is preferable to store the workpieces in respective workpiece storage cages each composed of wires and having a flange on a side thereof, and support the flanges of the workpiece storage cages with the supports, respectively. Since the bottoms of the workpieces are not covered with the supports, most of the surfaces of the workpieces are exposed. The workpieces can thus sufficiently be processed, e.g., cleaned, through the grid openings of the workpiece storage cages in the tanks. The workpieces together with the workpiece storage cages are vertically moved in the tanks by the lifting and lowering means, and transferred between the supports associated with the tanks by the feed means.

The tanks may include at least the cleaning tank, a rinsing tank, and a drying tank, and the rinsing tank may comprise a shower rinsing tank and/or an ultrasonic rinsing tank separate from the shower rinsing tank. Where a preliminary cleaning tank is separably joined to the cleaning tank, a workpiece in the preliminary cleaning tank can preliminarily be cleaned before being cleaned in the cleaning tank. Therefore, the workpiece can be cleaned at an increased-speed and accuracy.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

FIGS. 1 through 4 show a cleaning apparatus according to an embodiment of the present invention.

First, a workpiece storage cage H for storing a workpiece W while the workpiece W is being cleaned by the cleaning apparatus will be described below with reference to FIG. 4. The workpiece storage cage H is composed of wires W joined into a coarse grid and has a pair of flanges T on the upper ends of respective sides thereof.

Figure 1:
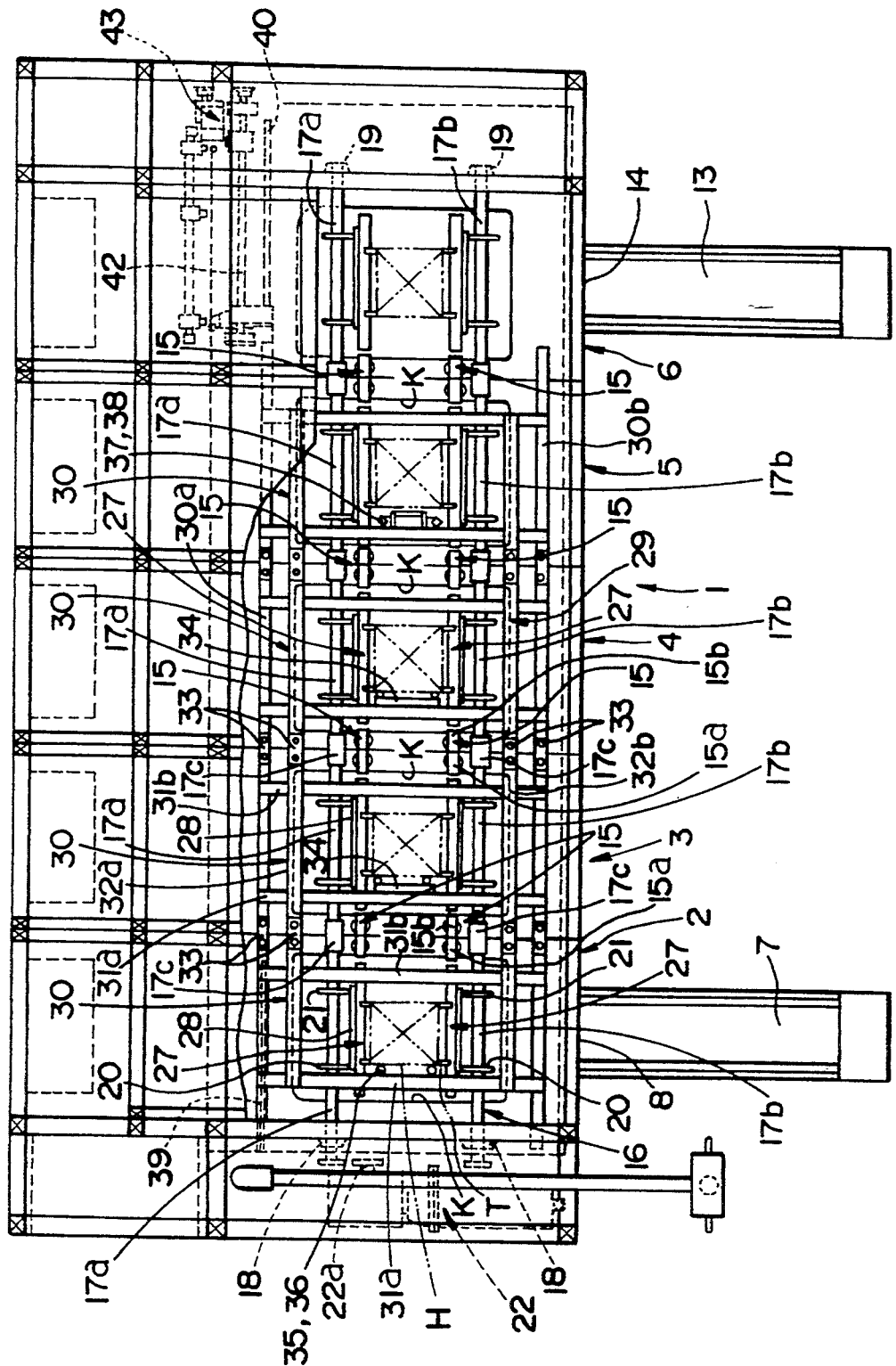
FIG. 1 is a plan view of a cleaning apparatus according to an embodiment of the present invention.
Figure 2:
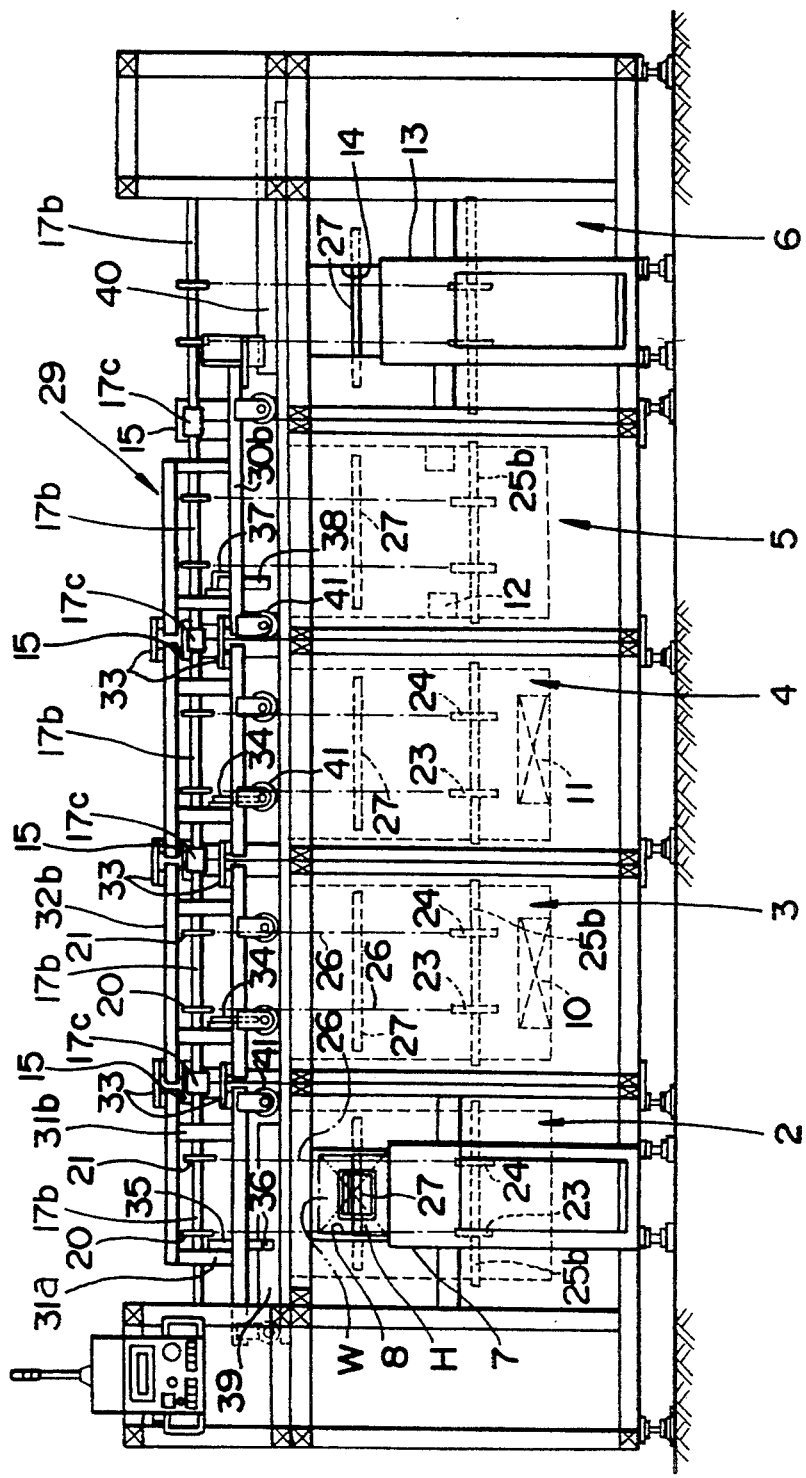
FIG. 2 is a front elevational view of the cleaning apparatus shown in FIG. 1.

The cleaning apparatus will be described below with reference to FIGS. 1 through 3. As shown in FIGS. 1 and 2, the cleaning apparatus, generally designated by the reference numeral 1, has a preliminary cleaning tank 2, an ultrasonic cleaning tank 3, an ultrasonic rinsing tank 4, a drying tank 5, and a discharger 6 which are arranged successively in the order named from left to right in FIGS. 1 and 2. The tanks 3 ~ 5 and the discharger 6 are independent of each other, and adjacent two of the tanks 3 ~ 5 and the discharger 6 are detachably coupled to each other by a joint member (not shown). Therefore, the tanks 3 ~ 5 and the discharger 6 can independently be replaced with other tanks and discharger.

The cleaning apparatus 1 also includes a loading conveyor 7 positioned in front of and extending into the preliminary cleaning tank 2. As shown in FIG. 3, the loading conveyor 7 supports thereon a plurality of workpiece storage cages H ($H_1 \sim H_3$) which store respective workpieces W ($W_1 \sim W_3$) therein. When the loading conveyor 7 is actuated, each of the workpiece storage cages H is moved on the loading conveyor 7 toward the preliminary cleaning tank 2 and then into the preliminary cleaning tank 2 through an inlet opening 8 defined in a front wall of the preliminary cleaning tank 2. The workpiece storage cage H that is loaded into the preliminary cleaning tank 2 is transferred from the loading conveyor 7 onto a support conveyor 9 which is positioned near the inner end of the loading conveyor 7. When the workpiece storage cage H is loaded into the preliminary cleaning tank 2, the workpiece storage cage H is held at rest on the support conveyor 9. While the workpiece storage cage H is being held at rest in the preliminary cleaning tank 2, the workpiece W in the workpiece storage cage H is preliminarily cleaned sufficiently by a shower of cleaning solution or water discharged downwardly from a shower nozzle 36 (described later on).

In FIG. 2, the ultrasonic cleaning tank 3 is filled with deaerated water, and houses an ultrasonic vibrator 10 mounted on the bottom thereof. When the ultrasonic vibrator 10 is actuated, it radiates an ultrasonic energy into the deaerated water in the ultrasonic cleaning tank 3, developing cavitation therein to clean a workpiece W that is immersed in the deaerated water.

The ultrasonic rinsing tank 4 is filled with tap water, and houses an ultrasonic vibrator 11 mounted on the bottom thereof. When the ultrasonic vibrator 11 is actuated, it produces air bubbles in the water in the ultrasonic rinsing tank 4 to rinse a workpiece W that is immersed in the water.

The drying tank 5 has a hot-air duct 12 disposed therein for ejecting hot air toward a workpiece W housed in the drying tank 5 for thereby drying the workpiece W.

The discharger 6 houses a support conveyor (not shown) identical to the support conveyor 9 in the preliminary cleaning tank 2 at the same level or height as the support conveyor 9. The support conveyor in the discharger 6 serves to receive a workpiece storage cage H, which stores a dried workpiece W, on its way down from above the discharger 6 when the workpiece storage cage H is lowered by a lifting and lowering mechanism 16 (described later on). The workpiece storage cage H that is received by the support conveyor in the discharger 6 is transferred from the support conveyor onto an unloading conveyor 13 having an inner end positioned near the support conveyor and extending out of the discharger 6. Then, when the unloading conveyor 13 is actuated, the workpiece storage cage H is discharged out of the discharger 6 through an outlet opening 14 defined in a front wall of the discharger 6.

Pairs of parallel spaced guides 15 are positioned in respective upper locations between the preliminary cleaning tank 2 and the ultrasonic cleaning tank 3, between the ultrasonic cleaning tank 3 and the ultrasonic rinsing tank 4, between the ultrasonic rinsing tank 4 and the drying tank 5, and between the drying tank 5 and the discharger 6. As shown in FIG. 3, each of the guides 15 comprises a short member of substantially U-shaped cross section having an upwardly open groove. When workpiece storage cages H move above the tanks $2 \sim 5$ toward the adjacent tanks $3 \sim 5$ and discharger 6, as described later on, the flanges T of the workpiece storage cages H are slidably supported in the upwardly open grooves of the guides 15. As illustrated in FIG. 1, each of the guides 15 is divided into a pair of guide elements 15a, 15b, and the guide elements 15a, 15b of each guide 15 are fixed to adjacent two of the preliminary cleaning tank 2, the ultrasonic cleaning tank 3, the ultrasonic rinsing tank 4, the drying tank 5, and the discharger 6.

As shown in FIGS. 1 and 2, the lifting and lowering mechanism 16 comprises pairs of parallel spaced drive shafts 17a, 17b disposed respectively above the tanks $2 \sim 5$ and the discharger 6 and extending horizontally along the array of the tanks $2 \sim 5$ and the discharger 6. The drive shafts 17a, 17b of the respective pairs are separably joined to each other by respective joints 17c between the preliminary cleaning tank 2 and the ultrasonic cleaning tank 3, between the ultrasonic cleaning tank 3 and the ultrasonic rinsing tank 4, between the ultrasonic rinsing tank 4 and the drying tank 5, and between the drying tank 5 and the discharger 6. The joined drive shafts 17a, 17b have opposite ends rotatably supported by bearings 18, 19 on upper portions of side members of the preliminary cleaning tank 2 and the discharger 6. The drive shafts 17a, 17b are also rotatably supported on the tanks $2 \sim 5$ and the discharger 6 by bearings (not shown).

A pair of spaced sprockets 20, 21 is mounted on each of the drive shafts 17a, 17b associated with the tanks $2 \sim 5$ and the discharger 6. The ends of the joined drive shafts 17a, 17b which are supported by and project from the bearings 18 are operatively coupled through a chain mechanism (not shown) to an output shaft 22a of a lifting and lowering mechanism actuator 22. When the output shaft 22a of the lifting and lowering mechanism actuator 22 is rotated about its axis, the drive shafts 17a, 17b are synchronously rotated in opposite directions, respectively, about their own axes.

Figure 3:
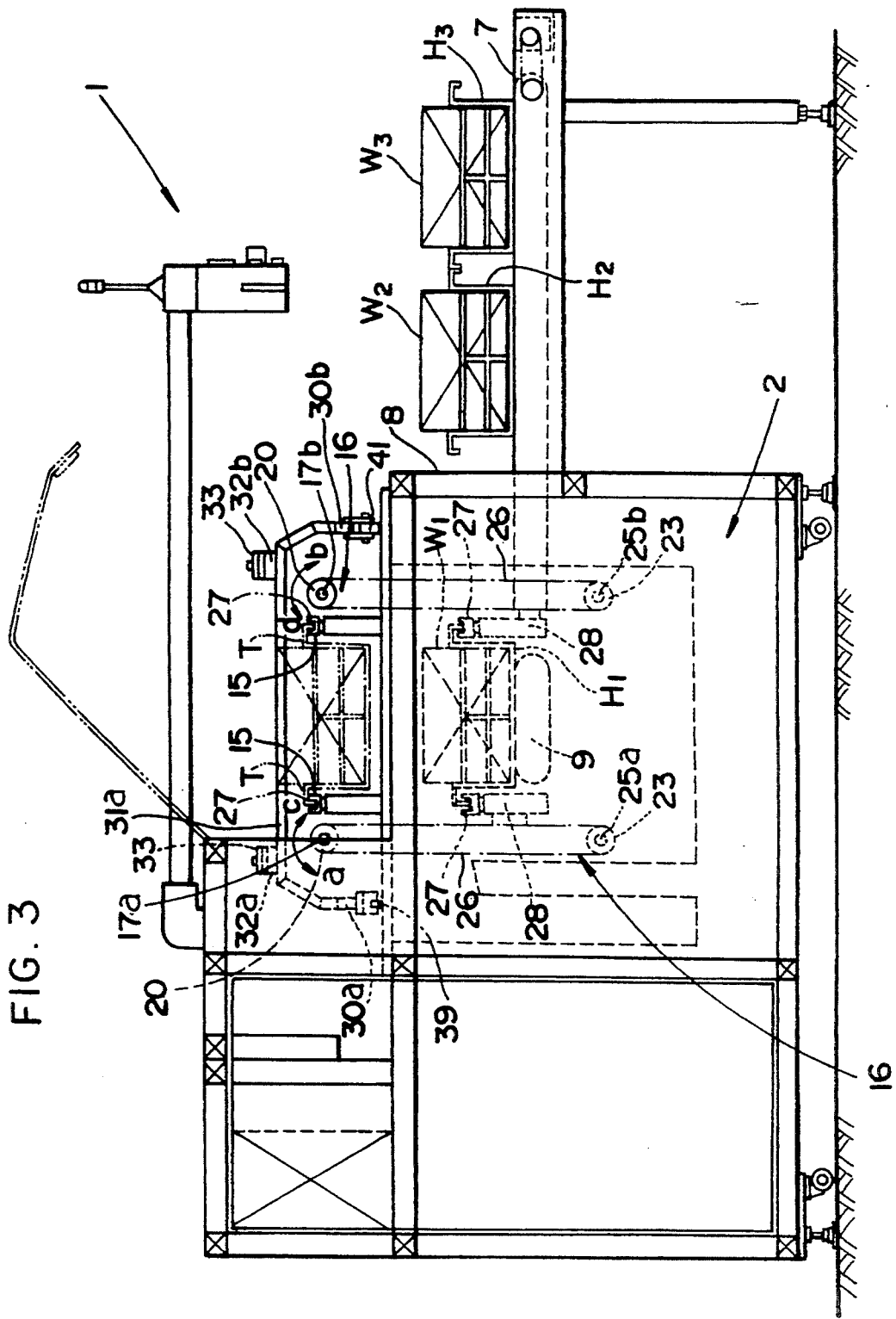
FIG. 3 is a side elevational view of the cleaning apparatus shown in FIG. 1.

As illustrated in FIGS. 2 and 3, each of the tanks $2 \sim 5$ and the discharger 6 houses a pair of spaced driven shafts 25a, 25b having sprockets 23, 24 in vertical alignment with the respective sprockets 20, 21. The driven shafts 25a, 25b extend horizontally and have respective axes positioned below the level of the support conveyor 9. Endless lifting and lowering mechanism chains 26 are vertically trained around the sprockets 20, 23 and also the sprockets 21, 24 in the tanks $2 \sim 5$ and the discharger 6. A pair of supports 27 (described later on) for supporting a workpiece storage cage H is fixed to the chains 26 by fixtures 28 in each of the tanks $2 \sim 5$ and the discharger 6. The driven shafts 25a, 25b, the lifting and lowering mechanism chains 26, and the sprockets 20, 21, 23, 24 jointly serve as a drive force transmitting mechanism.

When the drive shafts 17a, 17b in the preliminary cleaning tank 2 are rotated in respective opposite directions by the lifting and lowering mechanism actuator 22, the drive shafts 17a, 17b in the tanks $3 \sim 5$ and the discharger 6 are also rotated together in respective opposite directions. In response to the rotation of the drive shafts 17a, 17b, the chains 26 are now actuated to move the supports 27 vertically in the tanks $2 \sim 5$ and the discharger 6.

Figure 4:
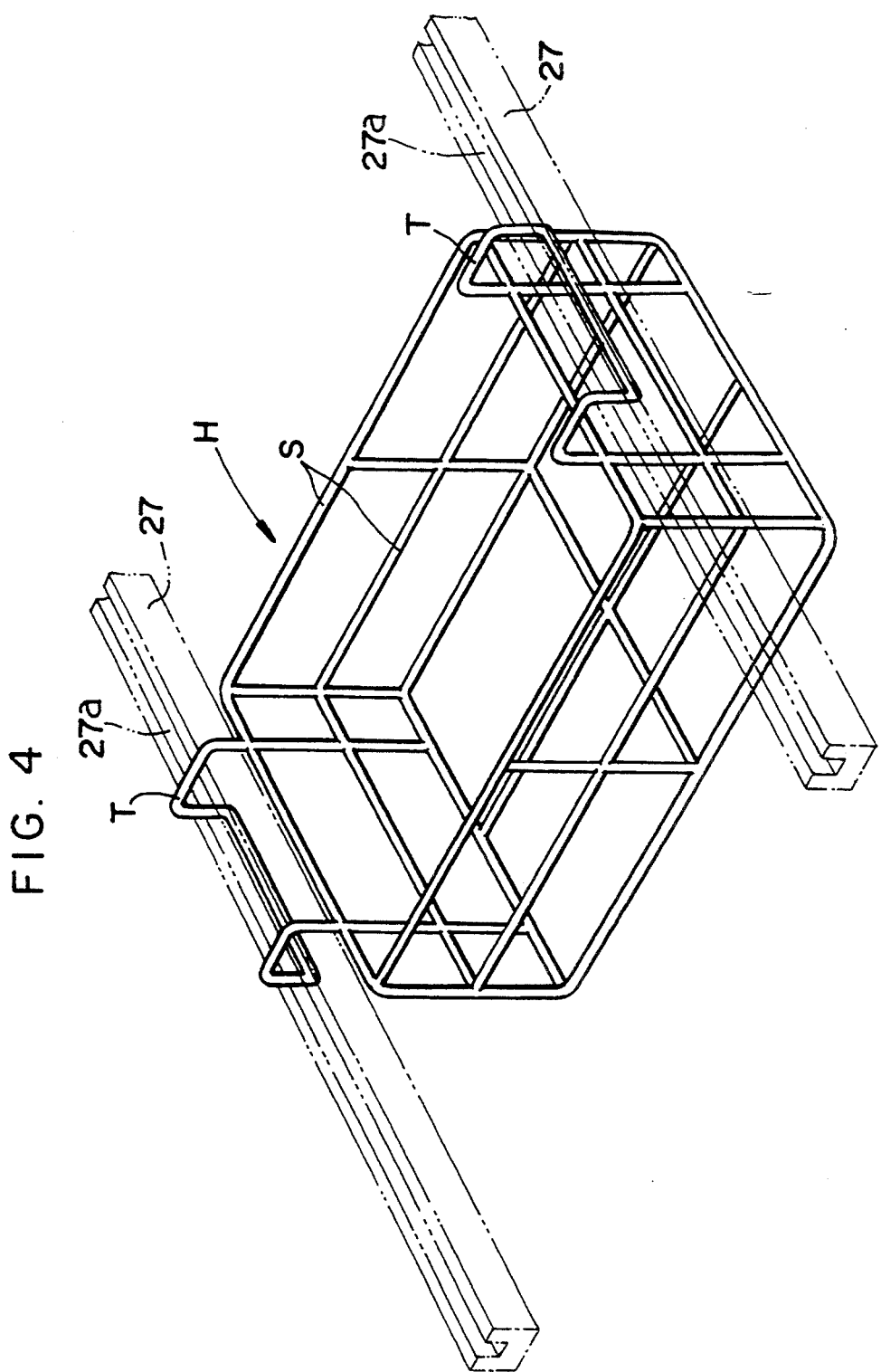
FIG. 4 is a perspective view of a workpiece storage cage in the cleaning apparatus shown in FIG. 1.

The supports 27 in each of the tanks $2 \sim 5$ and the discharger 6 comprise respective elongate members of substantially U-shaped cross section having upwardly open grooves 27a (see FIG. 4). The supports 27 are spaced from each other by the same distance as the distance by which the guides 15 are spaced from each other. The flanges T of each workpiece storage cage H are horizontally slidably supported in the grooves 27a. When the supports 27 are elevated by the lifting and lowering mechanism 16, the grooves 27a thereof are positioned at the same level or height as, and closely to, the grooves of the guides 15. Therefore, a workpiece storage cage H which has been elevated above one of the tanks 2~5 and the discharger 6 with the flanges T supported in the grooves 27a of the elevated supports 27 can smoothly slide from those supports 27 onto supports 27 elevated above an adjacent one of the tanks 2~5 and the discharger 6 through the guides 15. If there are very short distances present between the supports 27 in the tanks 2~5 and the discharger 6 when the supports are elevated, then a workpiece storage cage H can smoothly slide between the supports 27 in adjacent two of the tanks 2~5 and the discharger 6 even in the absence of the guides 15.

As shown in FIGS. 1 and 2, the cleaning apparatus also has a feed mechanism 29 which comprises a plurality of ladder-like mobile assemblies 30 positioned above the respective tanks 2~5. Each of the mobile assemblies 30 has a pair of parallel spaced rods 30a, 30b positioned one on each side of an upper opening K of one of the tanks 2~5 and horizontally elongate along the array of the tanks 2~5. The rods 30a, 30b are positioned outwardly of and extend along the drive shafts 17a, 17b. The rods 30a, 30b of each of the mobile assemblies 30 are interconnected by a pair of parallel spaced arms 31a, 31b horizontally extending perpendicularly to the rods 30a, 30b above and across the drive shafts 17a, 17b and positioned one on each side of a space for holding a workpiece storage cage H above one of the tanks 2~5. In each of the mobile assemblies 30, the arms 31a, 31b are reinforced by a pair of parallel spaced reinforcing bars 32a, 32b horizontally extending along the drive shafts 17a, 17b and mounted on upper surfaces of the arms 31a, 31b. The rods 30a, 30b of the mobile assemblies 30 are separably coupled to each other and the reinforcing bars 32a, 32b thereof are also separably coupled to each other by respective joints 33 between the preliminary cleaning tank 2 and the ultrasonic cleaning tank 3, between the ultrasonic cleaning tank 3 and the ultrasonic rinsing tank 4, between the ultrasonic rinsing tank 4 and the drying tank 5. Consequently, the mobile assemblies 30 associated with the respective tanks 2~5 are separable from each other.

Pressers 34 are mounted respectively on the arms 31a of the mobile assemblies 30 which are positioned above the ultrasonic cleaning tank 3 and the ultrasonic rinsing tank 4, respectively, for pressing workpiece storage cages H positioned above the ultrasonic cleaning tank 3 and the ultrasonic rinsing tank 4 respectively toward the ultrasonic rinsing tank 4 and the drying tank 5. A presser 35 is mounted on the arm 31a of the mobile assembly 30 which is positioned above the preliminary cleaning tank 2, for pressing a workpiece storage cage H positioned above the preliminary cleaning tank 2 toward the ultrasonic cleaning tank 3. The shower nozzle 36 for applying a shower of cleaning solution to a workpiece W on the support conveyor 16 in the preliminary cleaning tank 2 is attached to the presser 35. A presser 37 is mounted on the arm 31a of the mobile assembly 30 which is positioned above the drying tank 5, for pressing a workpiece storage cage H positioned above the drying tank 5 toward the discharger 6. An air blower 38 for applying a stream of air to a workpiece W in the drying tank 5 is attached to the presser 37.

As shown in FIG. 2, the joined rods 30a of the interconnected mobile assemblies 30 have opposite ends slidably fitted respectively over guides 39, 40 mounted on respective upper surfaces of the preliminary cleaning tank 2 and the discharger 6. A plurality of casters 41 are mounted at longitudinally spaced intervals on the joined rods 30b of the interconnected mobile assemblies 30 and rollingly supported on upper side edges of the tanks 2~5. The interconnected mobile assemblies 30 are thus movable horizontally in unison on the upper surfaces of the tanks 2~5. The end of the rod 30a of the mobile assembly 30 which is positioned above the drying tank 5 and fitted over the guide 40 is coupled through a feeder 42 to a feed mechanism actuator 43 disposed in the discharger 6.

The mobile assemblies 30 of the feed mechanism 29, which correspond to the respective tanks 2~5, can reciprocally be moved in unison when the mobile assembly 30 corresponding to the drying tank 5 is reciprocally moved horizontally for a certain distance by the feed mechanism actuator 43.

Operation of the cleaning apparatus 1 will now be described below. In the following description, a workpiece storage cage H placed on the support conveyor 9 will be referred to as a workpiece storage cage $H_1$, two workpiece storage cages H placed on the loading conveyor 7 as workpiece storage cages $H_1$, $H_2$, and workpieces W stored in the respective workpiece storage cages $H_1$, $H_2$, $H_3$ as workpieces $W_1$, $W_2$, $W_3$, respectively.

In FIG. 3, the workpiece storage cage $H_1$ with the workpiece $W_1$ stored therein, which has been transferred from the loading conveyor 7 to the support conveyor 9, is held at rest on the support conveyor 9 in the preliminary cleaning tank 1. The supports 27 of the lifting and lowering mechanism 16 in the preliminary cleaning tank 1 are positioned below the flanges T of the workpiece storage cage $H_1$. The workpiece $W_1$ in the workpiece storage cage $H_1$ is preliminarily cleaned by a shower of cleaning solution supplied from the shower nozzle 36. While the workpiece $W_1$ is being preliminarily cleaned, the mobile assemblies 30 of the feed mechanism 29 are reciprocally moved for a certain distance by the feed mechanism actuator 43, thereby moving the shower nozzle 36 reciprocally above the workpiece $W_1$. Accordingly, the workpiece $W_1$ is sufficiently cleaned by the shower of cleaning solution supplied from the shower nozzle 36.

After the workpiece $W_1$ is preliminarily cleaned by the shower of cleaning solution, the lifting and lowering mechanism actuator 22 rotates the drive shafts 17a, 17b in the respective directions indicated by the arrows a, b in FIG. 3 over the tanks 2~5 and the discharger 6. The supports 27 in the preliminary cleaning tank 2 are now lifted into horizontal alignment with the guides 15 above the preliminary cleaning tank 2 while supporting the respective flanges T of the workpiece storage cage $H_1$ from below. At this time, the supports 27 in the tanks 3~5 and the discharger 6 are also lifted into horizontal alignment with the guides 15 above the tanks 3~5 and the discharger 6.

Then, the mobile assemblies 30 of the feed mechanism 29 are moved to the right in FIG. 1 by the feed mechanism actuator 43. The workpiece storage cage $H_1$ is now pressed to the right by the presser 35 on the mobile assembly 30 associated with the preliminary cleaning tank 2. The flanges T of the workpiece storage cage $H_1$ are slid from the supports 27 above the preliminary cleaning tank 2 over the guides 15 between the tanks 2, 3 onto the supports 27 above the ultrasonic cleaning tank 3. The workpiece storage cage $H_1$ is now supported on the supports 27 above the ultrasonic cleaning tank 3.

Thereafter, the lifting and lowering mechanism actuator 22 rotates the drive shafts 17a, 17b in the respective directions indicated by the arrows c, d in FIG. 3 over the tanks 2~5 and the discharger 6. The workpiece storage cage $H_1$ which is supported on the supports 27 above the ultrasonic cleaning tank 3 is lowered into the ultrasonic cleaning tank 3, in which the workpiece $W_1$ stored in the workpiece storage cage $H_1$ is immersed in deaerated water and ultrasonically cleaned. At this time, the workpiece storage cage $H_2$ is transferred from the loading conveyor 7 onto the support conveyor 9 in the preliminary cleaning tank 2, and the workpiece $W_2$ in the workpiece storage cage $H_2$ is preliminarily cleaned by a shower of cleaning solution supplied from the shower nozzle 36.

While the workpiece $W_1$ is being ultrasonically cleaned in the ultrasonic cleaning tank 3, the workpiece storage cage $H_1$ is vertically moved reciprocally over a certain distance in the ultrasonic cleaning tank 3 at a position lower than the support conveyor 9 by the lifting and lowering mechanism 16. When the workpiece storage cage $H_1$ is vertically moved in the ultrasonic cleaning tank 3, the surfaces of the workpiece $W_1$ are subjected fully to the cavitation that is distributed in the ultrasonic cleaning tank 3, so that the workpiece $W_1$ can be cleaned to higher accuracy. Since the supports 27 support the flanges T on the upper ends of the opposite sides of the workpiece storage cage $H_1$, the supports 27 do not cover the bottom of the workpiece $W_1$ in the ultrasonic cleaning tank 3. The workpiece $W_1$ can thus sufficiently be cleaned by the action of the cavitation through the grid openings of the workpiece storage cage $H_1$.

After the workpiece $W_1$ is ultrasonically cleaned, the lifting and lowering mechanism actuator 22 rotates the drive shafts 17a, 17b in the respective directions a, b in FIG. 3 over the tanks 2~5 and the discharger 6. The supports 27 in the preliminary cleaning tank 2 are now lifted to support the respective flanges T of the workpiece storage cage $H_2$ from below, and position the workpiece storage cage $H_2$ above the preliminary cleaning tank 2. At the same time, the supports 27 in the ultrasonic cleaning tank 3 are now lifted to support the respective flanges T of the workpiece storage cage $H_1$ from below, and position the workpiece storage cage $H_1$ above the ultrasonic cleaning tank 3. The mobile assemblies 30 associated with the tanks 2~5 and the discharger 6 have now been returned to their original positions, respectively.

Then, the mobile assemblies 30 are moved to the right in FIGS. 1 and 2 by the feed mechanism actuator 43. The workpiece storage cage $H_2$ is now pressed to the right by the presser 35 on the mobile assembly 30 associated with the preliminary cleaning tank 2 until the workpiece storage cage $H_2$ reaches a position above the ultrasonic cleaning tank 3. Simultaneously, the workpiece storage cage $H_1$ is pressed to the right by the presser 35 on the mobile assembly 30 associated with the ultrasonic cleaning tank 3 until the workpiece storage cage $H_1$ reaches a position above the ultrasonic rinsing tank 4. Thereafter, the lifting and lowering mechanism actuator 22 rotates the drive shafts 17a, 17b in the respective directions c, d in FIG. 3 over the tanks 2~5 and the discharger 6. The workpiece storage cages $H_2$, $H_1$ are lowered into and immersed in the ultrasonic cleaning tank 3 and the ultrasonic rinsing tank 4, respectively. The workpieces $W_2$, $W_1$ stored in the workpiece storage cages $H_2$, $H_1$ are then ultrasonically cleaned and rinsed, respectively. At this time, the workpiece storage cage $H_3$ is transferred from the loading conveyor 7 onto the support conveyor 9 in the preliminary cleaning tank 2, and the workpiece $W_3$ in the workpiece storage cage $H_3$ is preliminarily cleaned by a shower of cleaning solution supplied from the shower nozzle 36.

After the workpieces $W_2$, $W_1$ are ultrasonically cleaned and rinsed, respectively, the lifting and lowering mechanism actuator 22 rotates the drive shafts 17a, 17b in the respective directions a, b in FIG. 3 over the tanks 2~5 and the discharger 6. The supports 27 in the preliminary cleaning tank 2 are now lifted to support the respective flanges T of the workpiece storage cage $H_3$ from below, and position the workpiece storage cage $H_3$ above the preliminary cleaning tank 2. At the same time, the supports 27 in the ultrasonic cleaning tank 3 are now lifted to support the respective flanges T of the workpiece storage cage $H_2$ from below, and position the workpiece storage cage $H_2$ above the ultrasonic cleaning tank 3. Similarly, the supports 27 in the ultrasonic rinsing tank 4 are lifted to support the respective flanges T of the workpiece storage cage $H_1$ from below, and position the workpiece storage cage $H_1$ above the ultrasonic rinsing tank 4. The mobile assemblies 30 associated with the tanks 2~5 and the discharger 6 have now been returned to their original positions, respectively.

Then, the mobile assemblies 30 are moved to the right in FIGS. 1 and 2 by the feed mechanism actuator 43. The workpiece storage cage $H_3$ is now pressed to the right by the presser 35 on the mobile assembly 30 associated with the preliminary cleaning tank 2 until the workpiece storage cage $H_3$ reaches a position above the ultrasonic cleaning tank 3. Simultaneously, the workpiece storage cage $H_2$ is pressed to the right by the presser 34 on the mobile assembly 30 associated with the ultrasonic cleaning tank 3 until the workpiece storage cage $H_2$ reaches a position above the ultrasonic rinsing tank 4, and the workpiece storage cage $H_1$ is pressed to the right by the presser 34 on the mobile assembly 30 associated with the ultrasonic rinsing tank 4 until the workpiece storage cage $H_1$ reaches a position above the drying tank 5. Thereafter, the lifting and lowering mechanism actuator 22 rotates the drive shafts 17a, 17b in the respective directions c, d in FIG. 3 over the tanks 2~5 and the discharger 6. The workpiece storage cages $H_3$, $H_2$, $H_1$ are lowered into the ultrasonic cleaning tank 3, the ultrasonic rinsing tank 4, and the drying tank 5, respectively. The workpiece storage cages $H_3$, $H_2$ are immersed in the ultrasonic cleaning tank 3 and the ultrasonic rinsing tank 4, respectively, and the workpieces $W_3$, $W_2$ stored in the workpiece storage cages $H_3$, $H_2$ are then ultrasonically cleaned and rinsed, respectively. The workpiece storage cage Hi is placed in the drying tank 5, and the workpiece $W_1$ in the workpiece storage cage $H_1$ is dried by hot air supplied from the hot-air duct 12.

After the workpieces $W_1$, $W_2$, $W_3$ are dried, ultrasonically cleaned and rinsed, respectively, the lifting and lowering mechanism actuator 22 rotates the drive shafts 17a, 17b in the respective directions a, b in FIG. 3 over the tanks 2~5 and the discharger 6. The supports 27 in the ultrasonic cleaning tank 3 are now lifted to support the respective flanges T of the workpiece storage cage H₃ from below, and position the workpiece storage cage H₃ above the preliminary cleaning tank 2. At the same time, the supports 27 in the ultrasonic rinsing tank 4 are now lifted to support the respective flanges T of the workpiece storage cage H₂ from below, and position the workpiece storage cage H₂ above the ultrasonic rinsing tank 4. Similarly, the supports 27 in the drying tank 5 are lifted to support the respective flanges T of the workpiece storage cage H₁ from below, and position the workpiece storage cage H₁ above the drying tank 4. The mobile assemblies 30 associated with the tanks 2~5 and the discharger 6 have now been returned to their original positions, respectively. Therefore, the presser 37 and the air blower 38 are positioned laterally of the workpiece storage cage H₁. Then, the air blower 38 is actuated to apply a stream of hot air to the workpiece W₁ for thereby assist in drying the workpiece W₁.

After the workpiece W₁ is dried by the applied hot air, the mobile assemblies 30 are moved to the right in FIGS. 1 and 2 by the feed mechanism actuator 43. The workpiece storage cage H₃ is now pressed to the right by the presser 34 on the mobile assembly 30 associated with the ultrasonic rinsing tank 4 until the workpiece storage cage H₃ reaches a position above the discharger 5. Simultaneously, the workpiece storage cage H₂ is pressed to the right by the presser 34 on the mobile assembly 30 associated with the ultrasonic rinsing tank 4 until the workpiece storage cage H₂ reaches a position above the drying tank 5, and the workpiece storage cage H₁ is pressed to the right by the presser 37 on the mobile assembly 30 associated with the drying tank 5 until the workpiece storage cage H₁ reaches a position above the discharger 6. Thereafter, the lifting and lowering mechanism actuator 22 rotates the drive shafts 17a, 17b in the respective directions c, d in FIG. 3 over the tanks 2~5 and the discharger 6. The workpiece storage cages H₃, H₂, H₁ are lowered into the ultrasonic rinsing tank 4, the drying tank 5, and the discharger 6, respectively. The workpiece storage cage. H₃ is immersed in the ultrasonic rinsing tank 4, and the workpiece W₃ stored in the workpiece storage cage H₃ is then ultrasonically rinsed. The workpiece storage cage H₂ is placed in the drying tank 5, and the workpiece W₂ in the workpiece storage cage H₂ is dried by hot air supplied from the hot-air duct 12. The workpiece storage cage H₁ is placed on the support conveyor (not shown) in the discharger 6 on its way down. The workpiece storage cage H₁ placed on the support conveyor is then transferred onto the unloading conveyor 13, and discharged thereby through the outlet opening 14 for retrieval.

In the cleaning apparatus 1, since adjacent two of the tanks 2~5 and the discharger 6 are detachably coupled to each other, they are replaceable independently of each other. If workpieces are to be rinsed with a shower of cleaning solution or water, for example, rather than being ultrasonically rinsed, depending on the type of the workpieces, it is not necessary to replace the cleaning apparatus 1 in its entirety, but only the ultrasonic rinsing tank 4 may be replaced with a shower rinsing tank (not shown). The cleaning apparatus 1 can thus be modified into a cleaning apparatus configuration including a shower rinsing function. Inasmuch as the mobile assemblies 30 of the feed mechanism 29 and the drive shafts 17a, 17b of the lifting and lowering mechanism 16 are separable in combination with the tanks 2~5 and the discharger 6, respectively, the mobile assembly 30 and the drive shafts 17a, 17b which belong to the ultrasonic rinsing tank 4, for example, may be replaced, as a unit coupled to the ultrasonic rinsing tank 4, with those of the shower rinsing tank. If the new shower rinsing tank and the ultrasonic rinsing tank 4 are structurally identical to each other, only the ultrasonic rinsing tank 4 itself may be replaced with the new shower rinsing tank while the mobile assembly 30 and the drive shafts 17a, 17b which belong to the ultrasonic rinsing tank 4 remain unremoved. Such a function replacing principle holds true for the other tanks and discharger.

If workpieces need to be rinsed with a shower of cleaning solution or water, for example, in addition to being ultrasonically rinsed, depending on the type of the workpieces, it is not necessary to replace the cleaning apparatus 1 in its entirety, but a new shower rinsing tank combined with its mobile assembly and drive shafts may be added as a unit between the ultrasonic rinsing tank 4 and the drying tank 5 or between the ultrasonic cleaning tank 3 and the ultrasonic rinsing tank 4. The cleaning apparatus 1 can thus be modified into a cleaning apparatus configuration including both an ultrasonic rinsing function and a shower rinsing function. Such a function adding principle holds true for the other tanks and discharger.

If the ultrasonic rinsing process, for example, is no longer necessary, it is not necessary to replace the cleaning apparatus 1 in its entirety, but the ultrasonic rinsing tank 4 with the corresponding mobile assembly 30 and the corresponding drive shafts 17a, 17b may be removed as a unit, and the ultrasonic cleaning tank 3 and the drying tank 5, which are combined with the corresponding mobile assemblies 30 and the corresponding drive shafts 17a, 17b, may be joined to each other. Such a function removing principle holds true for the other tanks and discharger.

If any of the tanks 2~5 and the discharger 6 or the mobile assembly 30 and the drive shafts 17a, 17b combined therewith fail to operate, then only the malfunctioning tank or tanks 2~5, discharger 6, mobile assembly or assemblies 30, or drive shaft or shafts 17a, 17b may be replaced with a new one so that the cleaning apparatus 1 can operate continuously without fail.

Since the tanks 2~5 and the discharger 6, and the mobile assembly 30 and the drive shafts 17a, 17b combined therewith are selectively replaceable, the cleaning apparatus 1 can easily and inexpensively be modified into a desired configuration depending on the type of workpieces to be cleaned and the degree of accuracy to which they are to be cleaned.

Figure 5:
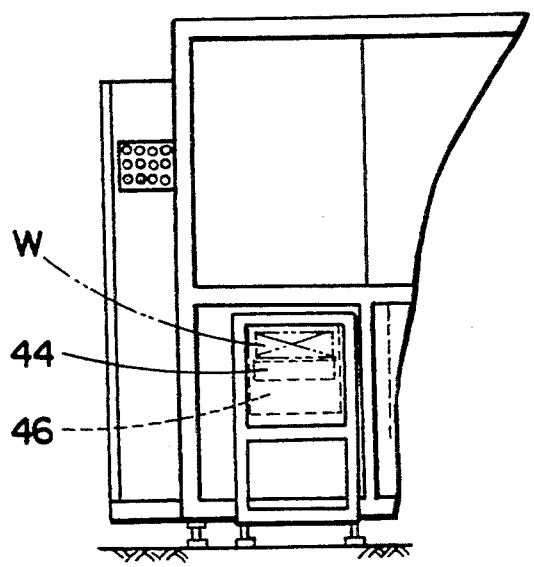
FIG. 5 is a fragmentary front elevational view of a cleaning apparatus according to another embodiment of the present invention.
Figure 6:
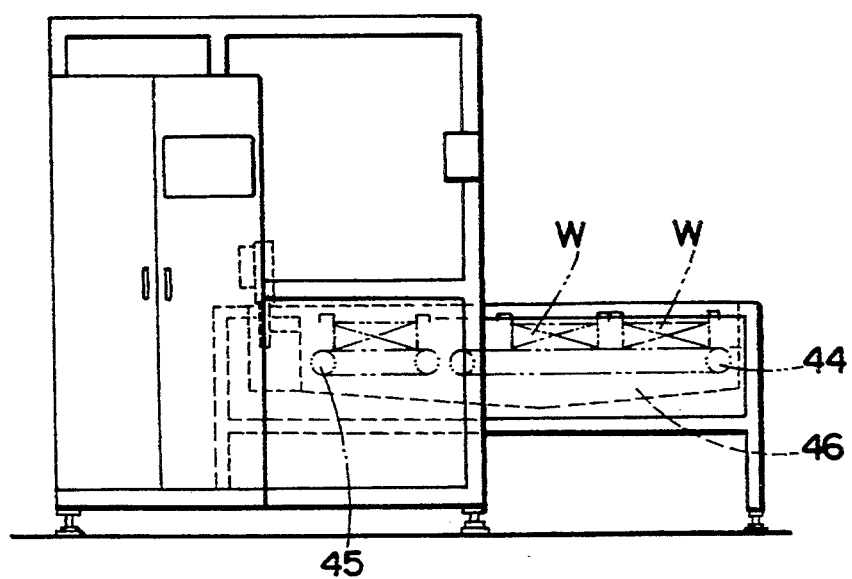
FIG. 6 is a side elevational view of the cleaning apparatus shown in FIG. 5.

In the above illustrated embodiment, a workpiece W is preliminarily cleaned by a shower of cleaning solution in the preliminary cleaning tank 2. However, as shown in FIGS. 5 and 6, a workpiece W may be placed on a loading conveyor 44 disposed in a water tank 46, and immersed in water in the water tank 46, and then may be transferred from the loading conveyor 44 onto a support conveyor 45 which is positioned also in the water tank 46. With such a modification, oil or the like on the workpiece W is prevented from being dried, and the workpiece W can subsequently be ultrasonically cleaned at an increased speed and accuracy.

While the preliminary cleaning tank 2 is provided with the shower nozzle 36 in the above embodiment, the shower nozzle 36 may be dispensed with, and the preliminary cleaning tank 2 may be used as a charger for charging workpieces W into the cleaning apparatus 10.

In the above illustrated embodiment, the drive shafts 17a, 17b and the mobile assemblies 30 are separably coupled between the tanks 2~5 and the discharger 6. However, if only the tanks 2~5 and the discharger 6 themselves are selectively replaceable, then the drive shafts 17a, 17b and the mobile assemblies 30 which are associated with the tanks 2~5 and the discharger 6 may be inseparably combined into an integral structure.

Furthermore, the drive shafts 17a, 17b and the mobile assemblies 30 are separably coupled between the tanks 2~5 and the discharger 6 and actuatable by the lifting and lowering mechanism actuator 22 and the feed mechanism actuator 43, respectively. However, the drive shafts 17a, 17b and the mobile assemblies 30 may be separate between the tanks 2~5 and the discharger 6, and actuated by lifting and lowering mechanism actuators 22 and feed mechanism actuators 43 that may be provided respectively in combination with the tanks 2~5 and the discharger 6.

Although certain preferred embodiments of the present invention has been shown and described in detail, it should be understood that various changes and modifications may be made therein without departing from the scope of the appended claims.

What is claimed is:

1. A cleaning apparatus comprising:
   an array of juxtaposed tanks including a cleaning tank;
   a plurality of supports associated with the respective tanks for vertical movement between lower positions in said tanks and upper positions above said tanks, for supporting workpieces processed in the tanks, respectively, said supports enabling sliding movement of said workpieces toward adjacent ones of the tanks;
   lifting and lowering means for lowering the supports into said tanks, respectively, to allow the workpieces to be processed in the tanks, and lifting the supports from the lower positions in said tanks up to the upper positions above said tanks after the workpieces supported on the supports lowered in said tanks are processed in said tanks; and
   feed means for sliding the workpieces supported on said supports onto supports associated with adjacent ones of said tanks while the supports are disposed in said upper positions,
   wherein said feed means comprises a plurality of mobile assemblies positioned above said tanks, respectively, for movement toward adjacent ones of said tanks, a plurality of pressers mounted on said mobile assemblies for pressing the workpieces on the supports toward adjacent ones of said tanks when the mobile assemblies move toward adjacent ones of said tanks while the supports supporting the workpieces are disposed in said upper positions, and actuating means coupled to at least one of said mobile assemblies for moving the mobile assembly to an adjacent one of said tanks while the supports supporting the workpieces are disposed in said upper positions, said mobile assemblies being separably joined between said tanks.

2. A cleaning apparatus according to claim 1, wherein said tanks include at least the cleaning tank, a rinsing tank, and a drying tank.

3. A cleaning apparatus according to claim 2, wherein said rinsing tank comprises at least one of a shower rinsing tank and an ultrasonic rinsing tank.

4. A cleaning apparatus according to claim 2, wherein said tanks include a preliminary cleaning tank separably joined to said cleaning tank.

5. A cleaning apparatus comprising:
   an array of juxtaposed tanks including a cleaning tank;
   a plurality of supports associated with the respective tanks for vertical movement between lower positions in said tanks and upper positions above said tanks, for supporting workpieces processed in the tanks, respectively, said supports enabling sliding movement of said workpieces toward adjacent ones of the tanks;
   lifting and lowering means for lowering the supports into said tanks, respectively, to allow the workpieces to be processed in the tanks, and lifting the supports from the lower positions in said tanks up to the upper positions above said tanks after the workpieces supported on the supports lowered in said tanks are processed in said tanks; and
   feed means for sliding the workpieces supported on said supports onto supports associated with adjacent ones of said tanks while the supports are disposed in said upper positions,
   wherein said lifting and lowering means comprises a plurality of drive shafts disposed respectively above said tanks for angular movement about their own axis and extending along said array of tanks, transmitting means for vertically moving said supports associated with the respective tanks in response to angular movement of said drive shafts, and actuating means for angularly moving said drive shafts to vertically move at least one of said supports, said drive shafts being separably joined between said tanks.

6. A cleaning apparatus according to claim 5, wherein said transmitting means comprises a plurality of driven shafts disposed in said tanks, respectively, below said drive shafts and extending parallel to said drive shafts, and a plurality of endless elements trained around said drive shafts and said driven shafts, respectively, for transmitting angular movement of said drive shafts to said driven shafts, said supports being attached to said endless elements, respectively, between said drive shafts and said driven shafts, said actuating means comprising means for reversibly angularly moving said drive shafts to vertically move said supports.

7. A cleaning apparatus according to claim 5, wherein said tanks include at least the cleaning tank, a rinsing tank, and a drying tank.

8. A cleaning apparatus according to claim 7, wherein said rinsing tank comprises at least one of a shower rinsing tank and an ultrasonic rinsing tank.

9. A cleaning apparatus according to claim 7, wherein said tanks include a preliminary cleaning tank separably joined to said cleaning tank.

10. A cleaning apparatus comprising:
    an array of juxtaposed tanks including a cleaning tank;
    a plurality of supports associated with the respective tanks for vertical movement between lower positions in said tanks and upper positions above said tanks, for supporting workpieces processed in the tanks, respectively, said supports enabling sliding movement of said workpieces toward adjacent ones of the tanks;
    lifting and lowering means for lowering the supports into said tanks, respectively, to allow the workpieces to be processed in the tanks, and lifting the supports from the lower positions in said tanks up to the Upper positions above said tanks after the workpieces supported on the supports lowered in said tanks are processed in said tanks;

feed means for sliding the workpieces supported on said supports onto supports associated with adjacent ones of said tanks while the supports are disposed in said upper positions; and a plurality of guides positioned between said tanks closely to adjacent ones of said supports when the supports are disposed in said upper positions, for guiding each of the workpieces when they are transferred from one of said supports to an adjacent one of the supports.

11. A cleaning apparatus according to claim 10, wherein said guides are separably joined between said tanks.

12. A cleaning apparatus according to claim 10, wherein said tanks include at least the cleaning tank, a rinsing tank, and a drying tank.

13. A cleaning apparatus according to claim 12, wherein said rinsing tank comprises at least one of a shower rinsing tank and an ultrasonic rinsing tank.

14. A cleaning apparatus according to claim 12, wherein said tanks include a preliminary cleaning tank separably joined to said cleaning tank.

15. A cleaning apparatus comprising:

an array of juxtaposed tanks including a cleaning tank;

a plurality of supports associated with the respective tanks for vertical movement between lower positions in said tanks and upper positions above said tanks, for supporting workpieces processed in the tanks, respectively, said supports enabling sliding movement of said workpieces toward adjacent ones of the tanks;

lifting and lowering means for lowering the supports into said tanks, respectively, to allow the workpieces to be processed in the tanks, and lifting the supports from the lower positions in said tanks up to the upper positions above said tanks after the workpieces supported on the supports lowered in said tanks are processed in said tanks;

feed means for sliding the workpieces supported on said supports onto supports associated with adjacent ones of said tanks while the supports are disposed in said upper positions; and a plurality of workpiece storage cages each composed of wires and having a flange on a side thereof, the flanges of said workpiece storage cages being slidably supported by said supports, respectively.

16. A cleaning apparatus according to claim 15, wherein said tanks include at least the cleaning tank, a rinsing tank, and a drying tank.

17. A cleaning apparatus according to claim 16, wherein said rinsing tank comprises at least one of a shower rinsing tank and an ultrasonic rinsing tank.

18. A cleaning apparatus according to claim 16, wherein said tanks include a preliminary cleaning tank separably joined to said cleaning tank.

* * * * *